United States Patent [19]

Kazami

[11] Patent Number: 5,578,938
[45] Date of Patent: Nov. 26, 1996

[54] SEMICONDUCTOR INTEGRATED CIRCUIT HAVING A CLOCK SKEW TEST CIRCUIT

[75] Inventor: Tetsuo Kazami, Tokyo, Japan

[73] Assignee: NEC Corporation, Japan

[21] Appl. No.: 494,493

[22] Filed: Jun. 26, 1995

[30] Foreign Application Priority Data

Jun. 27, 1994 [JP] Japan .................................. 6-145005

[51] Int. Cl.$^6$ ................................................ H03K 19/00
[52] U.S. Cl. ................................ 326/16; 371/1; 371/22.1; 327/292
[58] Field of Search .................... 326/16, 93; 327/292; 371/1, 22.1, 22.3, 22.5, 22.6

[56] References Cited

U.S. PATENT DOCUMENTS

| | | | |
|---|---|---|---|
| 5,235,566 | 8/1993 | Merrill | 371/22 |
| 5,337,321 | 8/1994 | Ozaki | 371/22 |
| 5,430,394 | 7/1995 | McMinn et al. | 327/292 |
| 5,479,127 | 12/1995 | Bui | 371/22 |
| 5,498,983 | 3/1996 | Schoellkopf | 371/1 |

FOREIGN PATENT DOCUMENTS 1-192215  8/1989  Japan .
2-232575  9/1990  Japan .

*Primary Examiner*—Edward P. Westin
*Assistant Examiner*—Richard Roseen

[57] ABSTRACT

A semiconductor integrated circuit has a test circuit capable of accurately measuring the clock skew of a clock signal in an LSI. The test circuit includes first and second flip flops driven by the clock signal in a maximum clock skew to receive a test signal. The test signal is supplied through a test signal input pin to data inputs of the first and second flip flops in the same signal delay. The outputs of the first and second flip flops are connected to the inputs of an exclusive OR gate. The test signal is varied stepwise by an amount at a time corresponding to the resolution of an LSI tester, and the output of the exclusive OR gate is detected to measure the clock skew in the clock signal.

8 Claims, 7 Drawing Sheets

PRIOR ART

SEMICONDUCTOR INTEGRATED CIRCUIT HAVING A CLOCK SKEW TEST CIRCUIT

BACKGROUND OF THE INVENTION (a) Field of the Invention

The present invention relates to a semiconductor integrated circuit having a clock skew test circuit and, more particularly, to a semiconductor integrated circuit including a test circuit for measuring a clock skew in a synchronous logic circuit.

(b) Description of the Related Art

Semiconductor integrated circuits operating in a synchronous mode are used in recent electronic apparatus such as personal computers, because such semiconductor integrated circuits can reduce the size of electronic apparatus and the power consumption thereof.

FIG. 1 is a schematic plan view of a conventional semiconductor integrated circuit operating in a synchronous mode for a specified function and formed on a main surface of a semiconductor substrate. As shown in FIG. 1, the conventional semiconductor integrated circuit 600 has clock input pin 101 for receiving a clock signal, main clock buffer 102 having an input connected to clock input pin 101, clock lines 103, 551, 552, and 553 extending from the output of main clock buffer 102 to drive secondary clock buffers 104, 105 and 106, each for providing the clock signal to corresponding one of clock lines.

The conventional semiconductor integrated circuit 600 includes clock line 122, clock node 568 of clock line 122, clock line 125 extending from the output of secondary clock buffer 106 to drive flip flops 119 and 121, clock line 516 extending from the out put of secondary clock buffer 105 to drive flip flops 508, 510 and 512, clock node 567 of clock line 516 connected to the clock input of flip flop 512, clock line 124 extending from the output of secondary clock buffer 104 to drive flip flops 108, 110 and 112, clock node 565 of clock line 124 connected to the clock input of flip flop 112. The flip flops 119 and 121, the flip flops 508, 510, and 512, and the flip flops 108, 109 and 110 constitute, for example, a frequency divider and registers, respectively.

The semiconductor integrated circuit 600 has inverters 114 and 115 which receive output 113 from flip flop 112, I/O buffer 116 which receives and amplifies output from inverter 115 to generate an output signal, I/O buffer 514 which receives and amplifies output 513 from flip flop 512 to generate an output signal, inverters 518 and 519 which receive output 517 from flip flop 121, and I/O buffer 520 which receives and amplifies output from inverter 519 to generate an output signal. I/O buffers 116, 514 and 520 are controlled by an external control signal 522 received through a control pin 523.

In the conventional semiconductor integrated circuit 600, the clock signal received through clock input pin 101 is transmitted to clock node 565 via main clock buffer 102, clock line 103, clock node 562, clock line 552, clock node 563, clock line 553, clock node 564, secondary clock buffer 104 and clock line 124. The propagation delay of the clock signal from clock input 101 to clock node 565 is the largest in the semiconductor integrated circuit 600.

By contrast, the clock signal is transmitted from clock input pin 101 to clock node 568 via main clock buffer 102, clock line 103, clock node 562, clock line 551, clock node 561, secondary clock buffer 106 and clock line 122. The propagation delay of the clock signal from clock input pin 101 to clock node 568 is the smallest in the semiconductor integrated circuit 600.

The propagation delay of the clock signal in the semiconductor integrated circuit 600 will be described with reference to FIG. 2.

When the clock signal supplied from the outside to clock input pin 101 rises at time instant t0, the signal level at clock node 568 rises at time instant t1. Namely, a propagation delay tpd1 (=t1−t0) is produced. At time instant t2, the signal level at clock node 565 rises so that flip flop 112 operates synchronously with the clock signal. Namely, a propagation delay tpd2 (=t2−t0) is produced, thereby generating a clock skew $\Delta T$ (=tpd2−tpd1).

As a result, the synchronous logic circuit of the semiconductor integrated circuit 600 operates under the clock skew $\Delta T$ corresponding to the difference in the propagation delay of the clock signal between clock nodes 568 and 565.

Under the clock skew produced in a conventional semiconductor integrated circuit, it is desirable to measure the maximum operational speed of the logic circuit so as to guarantee stable operation. For instance, Patent Publication JP-A-2-232575 describes a test circuit for measuring the operational speed of a logic circuit.

In the conventional test circuit of FIG. 3 described in the publication as mentioned above, a test signal 807 supplied through a test signal input pin 801 is transmitted to a delay circuit 808 such as a flip flop circuit to be tested, via transfer gate 802 having a gate receiving a clock signal $\phi 1$. The output of the delay circuit 803 is connected to a first input of an exclusive OR gate 805 via a transfer gate 804 having a gate receiving a clock signal $\phi 2$. Also, the test signal 807 supplied through the test signal input pin 801 is directly transmitted to a second input of the exclusive OR gate 805. With this structure, the propagation delay of the delay circuit 803 can be determined.

If the test circuit as described above is included in the semiconductor integrated circuit 600 operating in a synchronous mode and a clock test for measuring the operational speed is performed to verify the clock skew to be within a predetermined range, the stable operation of the semiconductor integrated circuit device can be verified.

Recent electronic apparatus requires a semiconductor integrated circuit of a larger scale having up to 1 million gates per a chip. The propagation delay of the clock signal depends on the planar layout of the semiconductor integrated circuit and the clock skew increases as the scale of the integration increases. Electronic apparatuses are required to operate at a clock frequency of up to approximately 100 MHz. Therefore, it is desirable to measure and determine a clock skew so as to guarantee an adequate operation.

That is, a test circuit such as described above is desired in an LSI. However, even when the conventional test circuit is included in a semiconductor integrated circuit, the value of the clock skew itself cannot be determined for a function circuit. Hence, it is difficult to provide a semiconductor integrated circuit having a stable synchronous logic circuit.

SUMMARY OF THE INVENTION

In view of the foregoing, it is an object of the present invention to provide a semiconductor integrated circuit having a clock skew test circuit for measuring a clock skew in the semiconductor integrated circuit.

The present invention provides an improved clock skew test circuit for measuring the clock skew of a clock signal in a synchronous semiconductor integrated circuit having, for example, a plurality of flip flops which hold or store data synchronously with a clock signal, a clock buffer for enhancing the drivability of the clock signal, and clock signal lines formed on a main surface of a semiconductor substrate.

According to a first aspect of the present invention, there is provided a semiconductor integrated circuit comprising: a clock signal input pin for receiving a clock signal; a test signal input pin for receiving a test signal; a first and a second flip flops each having a data input and a clock input; a first and a second test signal transmission means each for transmitting the test signal to the data input of corresponding one of the first and second flip flops, the first signal transmission means producing a propagation delay substantially same as the propagation delay of the second signal transmission means; a first and a second clock signal transmission means each for transmitting the clock signal to the clock input of corresponding one of the first and second flip flops; the first clock signal transmission means producing a propagation delay smaller than the propagation delay of the second clock signal transmission means; and a coincidence detection means for detecting coincidence of the output of the first flip flop with the output of the second flip flop.

According to a second aspect of the present invention, there is provided a semiconductor integrated circuit comprising: a clock signal input pin for receiving a clock signal; a test signal input pin for receiving a test signal; a first through fourth flip flops each having a data input and a clock input; a first and a second test signal transmission means each for transmitting the test signal to the data input of corresponding one of the first and second flip flops, the first signal transmission means producing a propagation delay substantially same as the propagation delay of the second signal transmission means; a third and fourth test signal transmission means each for transmitting the test signal to the data input of corresponding one of the third and fourth flip flops, the third signal transmission means producing a propagation delay substantially same as the propagation delay of the fourth signal transmission means; a first and a second clock signal transmission means each for transmitting the clock signal to the clock input of corresponding one of the first and second flip flops, the first clock signal transmission means producing a propagation delay smaller than the propagation delay of the second clock signal transmission means; a third and a fourth clock signal transmission means each for transmitting the clock signal to the clock input of corresponding one of the third and fourth flip flops, the third clock signal transmission means producing a propagation delay substantially same as the propagation delay of the fourth clock signal transmission means; a selector, responsive to a control signal, for selecting the outputs of the first and second flip flops or the outputs of the third and fourth flip flops to supply a pair of outputs of the selector; and a coincidence detection means for detecting coincidence between the pair of outputs of the selector.

In accordance with the semiconductor integrated circuit of the present invention, the value of the clock skew can be measured in the semiconductor integrated circuit by varying an external test signal stepwise by an amount at a time within the range of the resolution of an LSI tester to assure a correct operation of the semiconductor integrated circuit.

The above and other-objects, features and advantages of the present invention will be more apparent from the following description.

DESCRIPTION OF THE PREFERRED EMBODIMENTS

Now, semiconductor integrated circuits according to embodiments of the present invention will be described with reference to the accompanying drawings.

Figure 4:
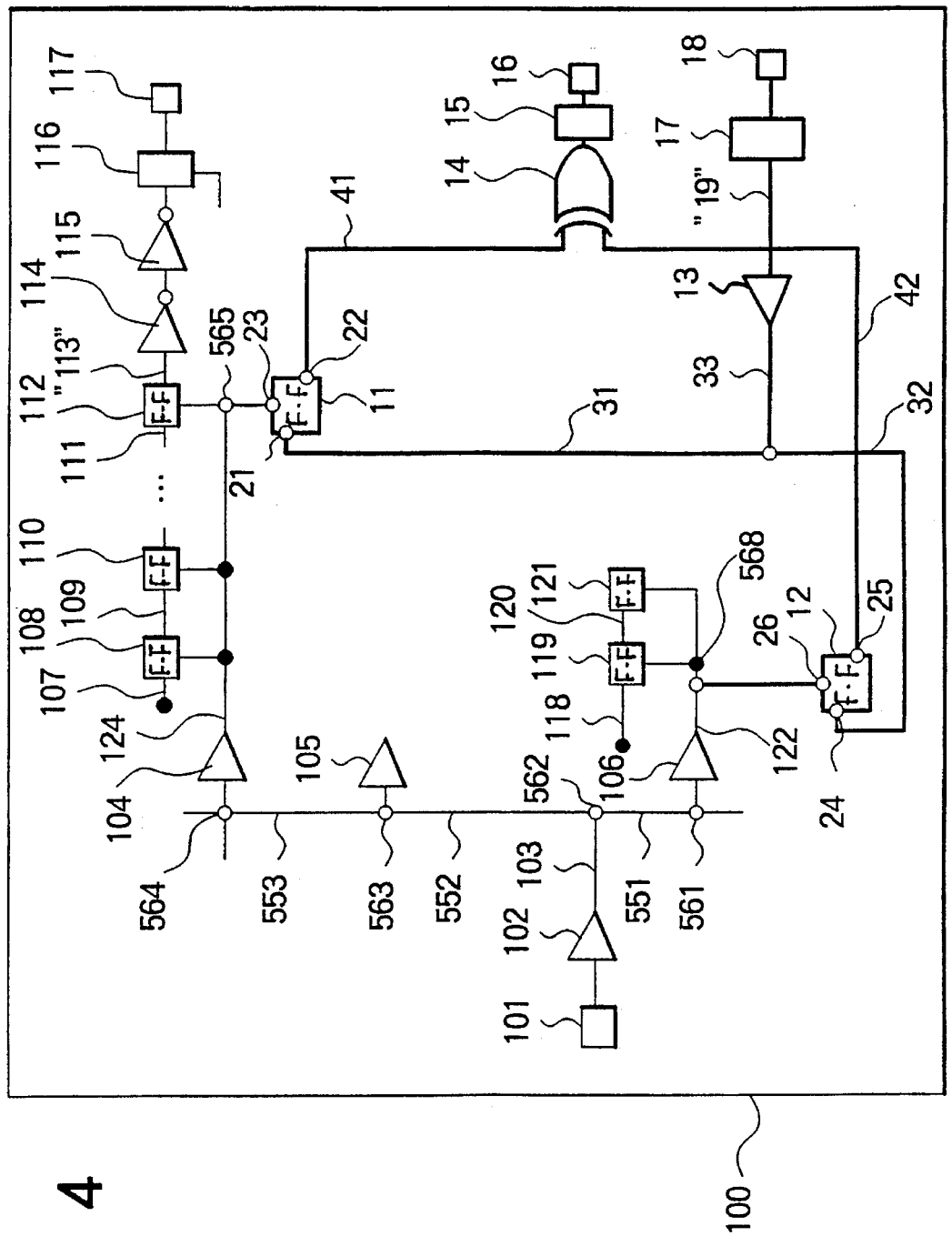
FIG. 4 is a block diagram of a semiconductor integrated circuit according to a first embodiment of the present invention.

Referring to FIG. 4, the semiconductor integrated circuit 100 according to a first embodiment of the present invention has synchronous circuitry for operating a specified function and a clock skew test circuit, which includes test signal input pin 18 for receiving an external test signal, an I/O buffer 17 having an input connected to test signal input pin 18, a buffer 13 which receives and amplifies output 19 from I/O buffer 17, test signal line 33 extending from the output of buffer 13, and test signal node 30 of the test signal line 33. In the drawing, the elements and lines in the clock skew test circuit are drawn by thick lines for a better understanding of the drawing.

The clock skew test circuit also includes a first flip flop 12 having a clock input 26 and a data input 24, a second flip flop 11 having a clock input 23 and a data input 21, an exclusive OR gate (hereinafter referred to as "XOR" gate) 14, an I/O buffer 15 and a test signal output pin 16. Clock input 26 of flip flop 12 is connected to clock node 568 of clock signal line 122, which receives the clock signal of the smallest propagation delay in the circuit, while data input 24 of flip flop 12 is connected to test signal node 30 of test signal line 33 via clock line 32. Clock input 23 of flip flop 11 is connected to clock node 565 of clock signal line 124, which receives the clock signal of the largest propagation delay in the circuit, while date input 21 of flip flop 11 is connected to test signal node 30 of test signal line 33 via clock line 31 which has substantially the same length as that of test signal line 32. Test signal lines 41 and 42 extending from the outputs 22 and 25 of flip flops 11 and 12, respectively, are connected to respective inputs of XOR gate 14. The XOR gate 14 supplies an output signal through test signal output pin 16 and I/O buffer 15.

Figure 1:
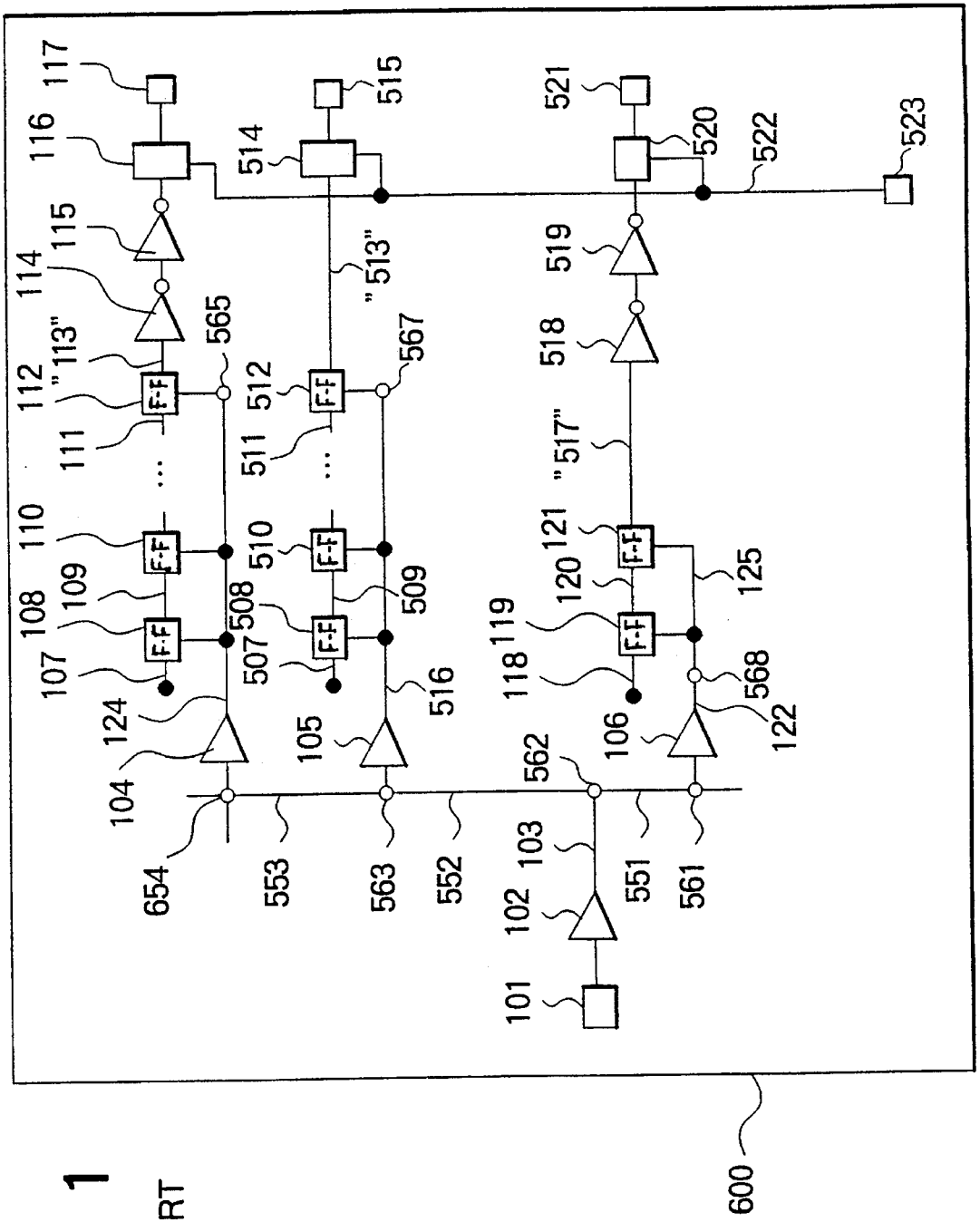
FIG. 1 is a block diagram of a conventional semiconductor integrated circuit.
Figure 2:
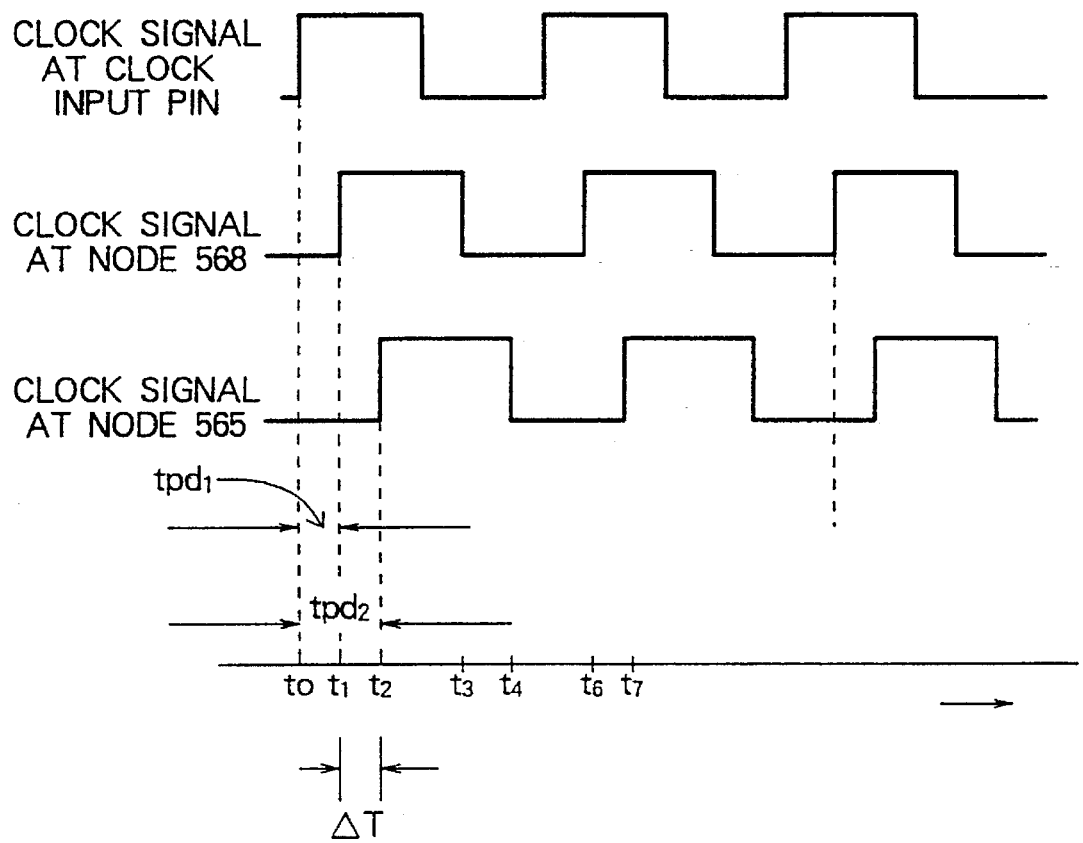
FIG. 2 is a timing chart showing the operation of the semiconductor integrated circuit shown in FIG. 1.
Figure 3:
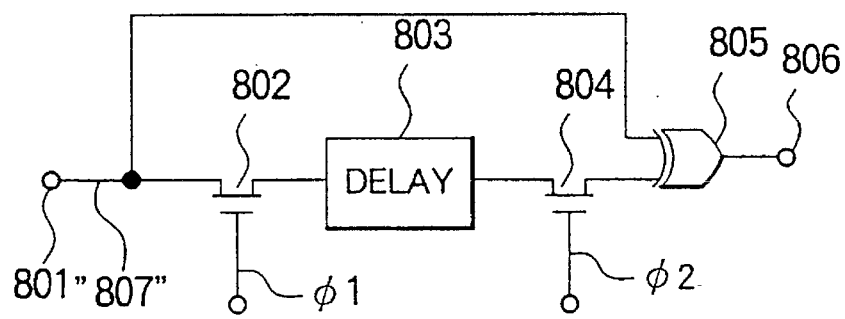
FIG. 3 is a circuit diagram of a conventional clock test circuit in a semiconductor integrated circuit.

The structure and the function of the remaining circuitry are the same as those of the circuitry of the conventional semiconductor integrated circuit of FIG. 1 although some of them are omitted in FIG. 4. Similar constituent elements are designated by the same reference numerals throughout the drawings.

Operation of the semiconductor integrated circuit according to the first embodiment will be described with reference to FIGS. 5 and 6, which show different timing of test signals supplied through test signal input pin 18.

Figure 5:
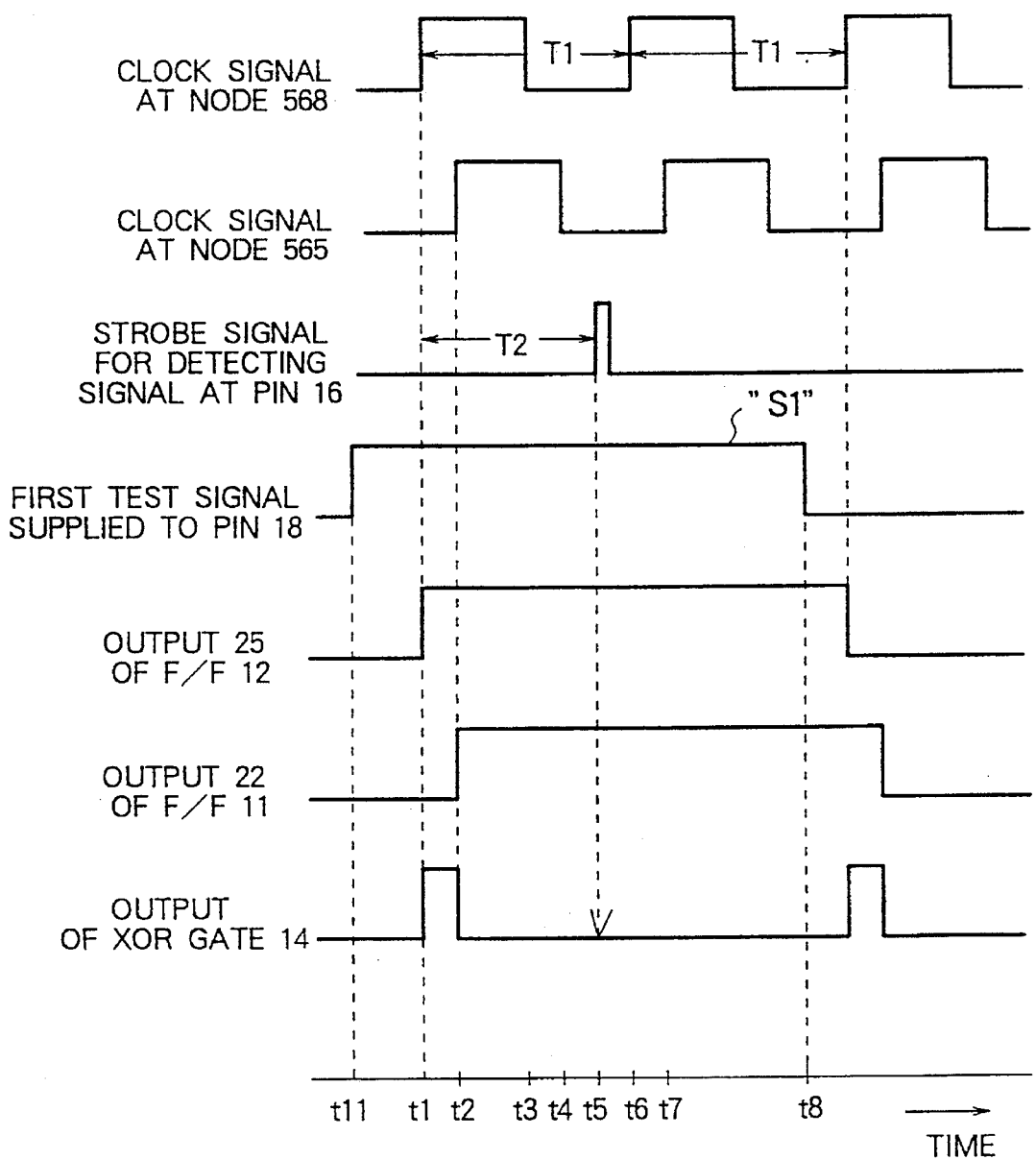
FIG. 5 is a timing chart showing the operation of the clock skew test circuit in the semiconductor integrated circuit of FIG. 4 responding to a first test signal.

In FIG. 5, signal patterns are shown which include clock signal at clock node 568, clock signal at clock node 565, strobe signal supplied to detect the signal at test signal output pin 16, first test signal "S1" supplied through test signal input pin 18, the outputs of flip flop 12, flip flop 11 and XOR gate 14. FIG. 6 shows signal patterns similarly to FIG. 5 in accordance with a second and a third test signal S2, S3 supplied through test signal input pin. The signal level at clock node 568 rises at time instant t1 due to the clock signal supplied through clock input pin 101 so that flip flop 12 receives a test signal through data input 24 and supplies an output signal through the output 25 thereof. The signal level at clock node 565 rises at time instant t2 so that flip flop 11 receives a test signal through data input 21 and supplies an output signal through output 22 thereof.

With this operation, after a test signal is supplied through the test signal input pin 18, two output signals having different levels are supplied to XOR gate 14 during the period between time instant t1 and time instant t2 so that XOR gate 14 generates a signal of high level.

In a first test condition as shown in FIG. 5, the level of the first test signal rises at time instant t11 which precedes time instant t1, and falls at time instant t8 before double the period T1 of the clock signal has elapsed since time instant t1.

The output 25 of flip flop 12 first rises at time instant t1, and the output 22 of flip flop 11 thereafter rises at time instant t2. Consequently, the output of XOR gate 14 stays at a low level prior to time instant t1, rises at time instant t1 and stays high during the period between time instants t1 and t2, and falls at time instant t2.

If the output signal of XOR gate 14 supplied through test signal output pin 16 is detected using the strobe signal which rises at time instant r5, as shown in FIG. 5, before the period T1 of the clock signal has passed, it is detected that the output of XOR gate 14 stays low at time instant t5.

Figure 6:
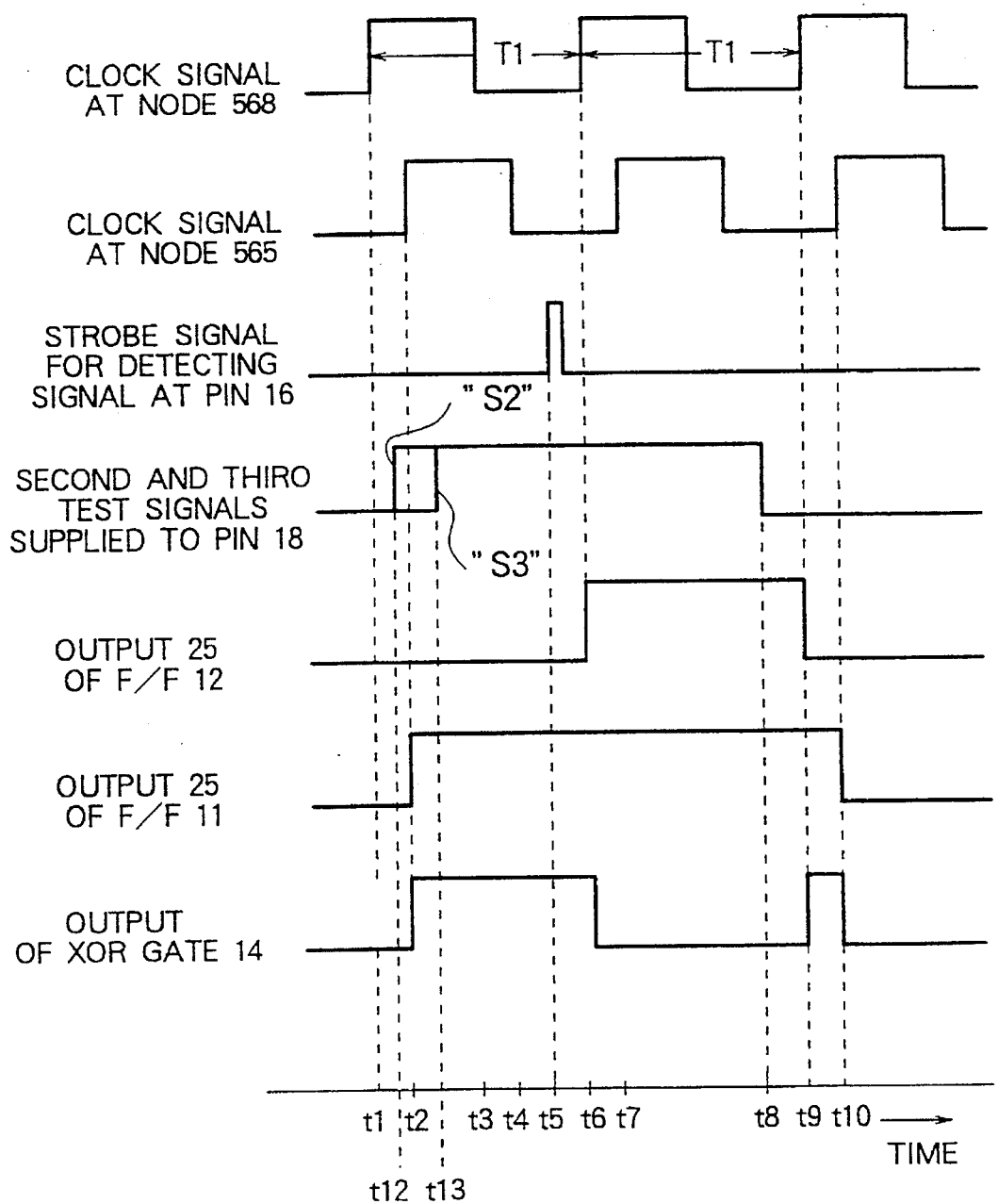
FIG. 6 is another timing chart showing the operation of the clock skew test circuit in the semiconductor integrated circuit of FIG. 4 responding to a second and a third test signal.

In a second test condition, as shown in FIG. 6, the level of the second test signal (S2) rises at time instant t12 between time instants t1 and t2, and falls at time instant t8 before double the period T1 of the clock signal has elapsed since time instant t1.

In this case, the output 25 of flip flop 12 stays low at time instant t1. The output 22 of flip flop 11 rises at time instant t2, because the level of the second test signal (S2) rises at time instant t12.

Consequently, the output of XOR gate 14 rises at time instant t2. At time instant t6 corresponding to the leading edge of the next period of the clock signal at clock node 568, a signal of high level is stored in flip flop 12 so that the output 25 of flip flop 12 rises, and consequently, the output of XOR gate 14 falls at time instant t6.

If the output signal of XOR gate 14 supplied through test signal output pin 16 is detected using a strobe signal which is generated at time instant t5, it is detected that the output of XOR gate 14 stays high at time instant t5.

In a third test condition, the level of a third test signal (S3) rises at time instant t23 between time instants t2 and t3, and falls at time instant t8 before double the period T1 of the clock signal has elapsed since time instant t1.

In this case, both of the output 25 of flip flop 12 and the output 22 of flip flop 11 stay low at time instant t1. Even at time instant t2, the output 22 of flip flop 11 stays low, because flip flop 11 only receives data of low level. As a result, the output of XOR gate 14 is maintained at a low level prior to time instant t2.

The level of the test signal supplied to data inputs 24 and 21 of flip flops 12 and 11 rises at time instant t23. However, the test signal of high level can be stored in flip flops 12 and 11 at time instants t9 and t10, respectively, in the next period of the clock signal. Accordingly, the level of the output of XOR gate 14 is maintained at a low level prior to time instant t9, passing time instant t2.

If the output signal of XOR gate 14 supplied through test signal output pin 16 is detected using the strobe signal generated at time instant t5, it is detected that the S output of XOR gate 14 stays low at time instant t5.

As described above, the level of the output of XOR gate 14 can be changed from low to high and then high to low by varying the timing of a rise in a test signal from time instant t11 to time instant t3, passing time instant t2.

In detail, the time instant of a rise in a test signal is varied stepwise by an amount at a time corresponding to the resolution of an LSI tester during a test procedure. With this operation, the level of the output of XOR gate 14 first rises from low to high, and then falls from high to low if the rise in the test signal passes time instants t1 and t2. The difference between the first and second time instants between the rise of the output signal can be measured as the clock skew between the leading edge of the clock signal supplied to clock node 568 and the leading edge of the clock signal supplied to clock node 565.

Since the resolutions of the drivers in now available LSI testers are in the range of 20–30 pS, the clock skew can be measured with sufficient accuracy in the range of 0.1–0.5 nS.

Figure 7:
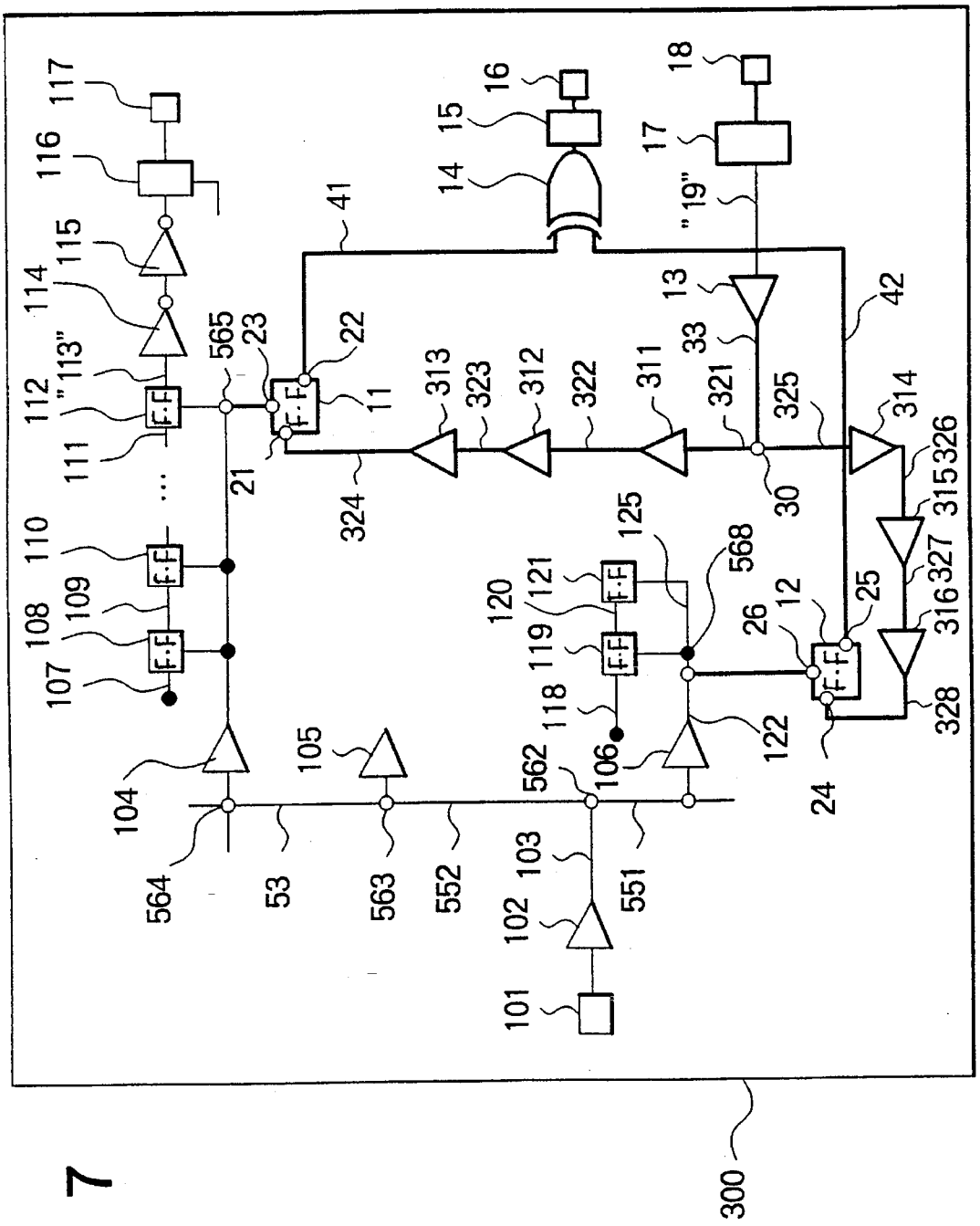
FIG. 7 is a block diagram of a semiconductor integrated circuit according to a second embodiment of the present invention.

Referring to FIG. 7, a semiconductor integrated circuit 300 according to a second embodiment of the present invention includes test signal line 321 and 325 extending from test signal node 30 and having the same length, a buffer 314 having an input connected to test signal line 325, test signal line 326 extending from the output of buffer 314, a buffer 315 having an input connected to test signal line 326, a test signal line 327 extending from the output of buffer 315, a buffer 316 having a input connected to test signal line 327, a test signal line 328 extending from the output of buffer 316 and connected to data input of a flip flop 12, a buffer 311 having an input connected to test signal line 321 and producing the same amount of delay as buffer 314 does, a test signal line 322 extending from the output of buffer 311 and having the same length as test signal line 326, a buffer 312 having an input connected to test signal line 322 and producing the same amount of delay as buffer 315 does, a test signal line 323 extending from the output of buffer 312 and having the same length as test signal line 327, a buffer 313 having an input connected to test signal line 323 and producing the same amount of delay as buffer 316 does, a test signal line 324 extending from the output of buffer 313 and connected to data input of a flip flop 11.

The remaining functional portions are same as those of the semiconductor integrated circuit device of the first embodiment, and similar constituent elements are designated by the same reference numerals.

Since the operation of the semiconductor integrated circuit according to the present embodiment is same as that of the semiconductor integrated circuit of the first embodiment, the test procedure is same as that of the first embodiment.

In the semiconductor integrated circuit of the second embodiment, buffers 314, 315 and 316 are inserted between test signal node 30 and data input 24 of flip flop 12 while buffers 311, 312 and 313 are inserted between test signal node 30 and data input 21 of flip flop 11. The test signal are subjected to waveform shaping before being transmitted to data input 24 of flip flop 12 and data input of flip flop 11, respectively, so that the measurement can be carried out more accurately and more stably.

Figure 8:
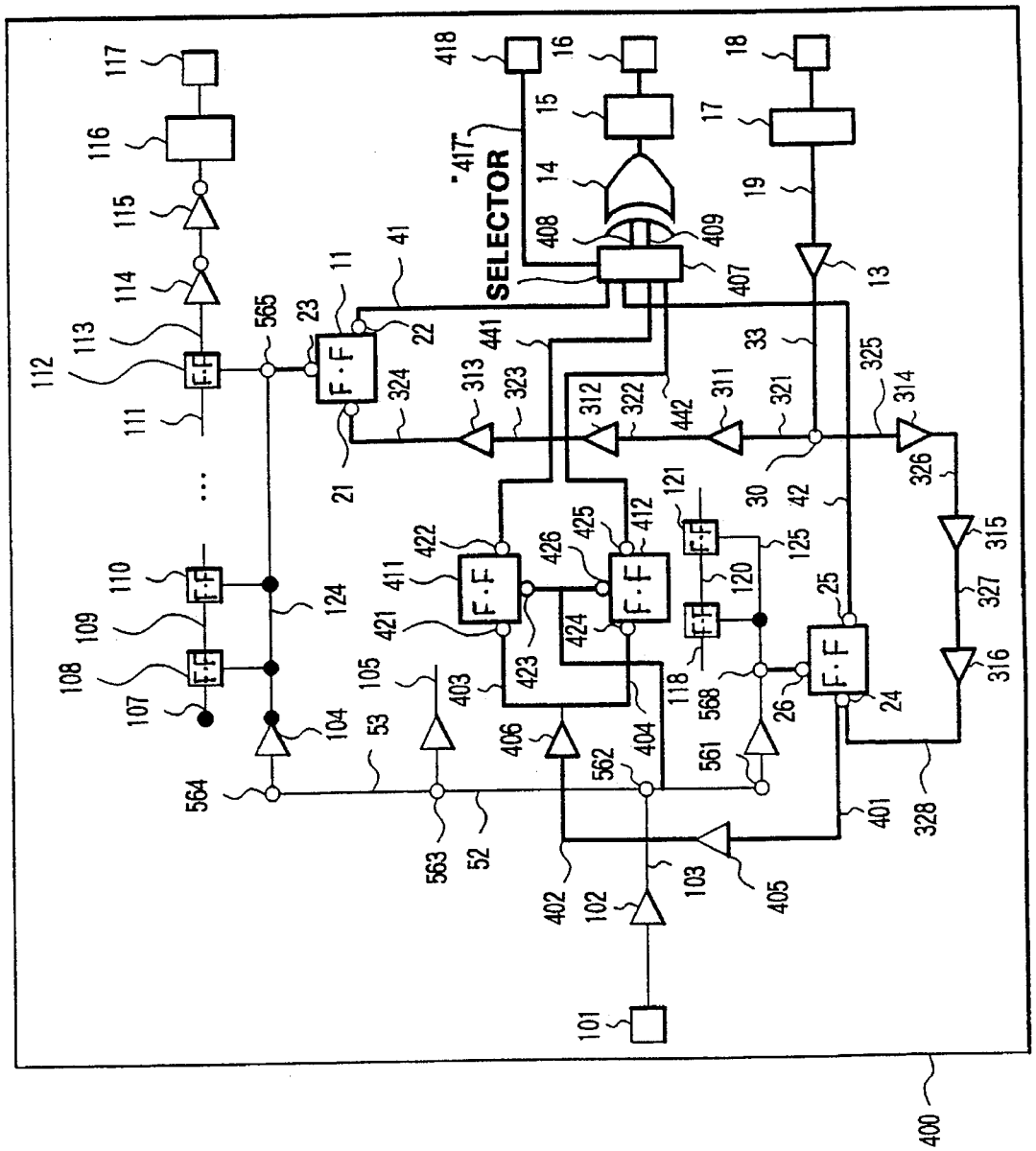
FIG. 8 is a block diagram of a semiconductor integrated circuit according to a third embodiment of the present invention.

Referring to FIG. 8, a semiconductor integrated circuit 400 according to a third embodiment of the present invention includes a test signal line 401 extending from test signal node 24, a buffer 405 having a data input connected to test signal line 401, test signal line 402 extending from the output of buffer 405, a buffer 406 having an input connected to test signal line 402, test signal lines 403 and 404 extending from the output of buffer 406 and having the same length, a flip flop 411 having a clock input 423 connected to clock line 427 extending from clock node 562 and a data input 421 connected to test signal line 402, a flip flop 412 having a clock input 426 connected to clock line 427 and a data input 424 connected to test signal line 404, and a selector 407 which selects outputs 422 and 425 from flip flops 411 and 412 or outputs 22 and 25 from flip flops 11 and 12 in accordance with a control signal 417 supplied through a control pin 418 and outputs selected output signals to the XOR gate 14.

The remaining functional portions are same as those of the semiconductor integrated circuit of the second embodiment, and the same constituent elements are designated by the same reference numerals.

In the semiconductor integrated circuit of the present embodiment, outputs from flip flops 411 and 412 are selected by a control signal 417, the test signal is then varied to measure delay amount produced in the test system including flip flops 411 and 412, XOR gate 14 and I/O buffer 15, and the LSI tester, and the LSI tester is calibrated using the measured delay as an initial value or zero value.

Next, the level of the control signal 417 is changed to select the outputs of flip flops 11 and 12, and the clock skew is measured similarly to the semiconductor integrated circuit of the first and second embodiments. The following test procedure is similar to that of the first embodiment.

By carrying out the calibration of the LSI tester, the delay in the test system including the test circuit of the semiconductor integrated circuit and the LSI tester can be substantially eliminated, thereby making it possible to carry out the measurement with an increased accuracy.

Since above embodiments are described only for examples, the present invention is not limited to such embodiments and it will be obvious for those skilled in the art that various modifications or alterations can be easily made based on the above embodiments within the scope of the present invention.

What is claimed is:

1. A semiconductor integrated circuit comprising: a clock signal input pin for receiving a clock signal; a test signal input pin for receiving a test signal; a first and a second flip flops each having a data input and a clock input; a first and a second test signal transmission means each for transmitting said test signal to said data input of corresponding one of said first and second flip flops, said first signal transmission means producing a propagation delay substantially same as the propagation delay of said second signal transmission means; a first and a second clock signal transmission means each for transmitting said clock signal to said clock input of corresponding one of said first and second flip flops; said first clock signal transmission means producing a propagation delay smaller than the propagation delay of said second clock signal transmission means; and a coincidence detection means for detecting coincidence of the output of said first flip flop with the output of said second flip flop.

2. A semiconductor integrated circuit as defined in claim 1 wherein each of said test signal transmission means includes a test signal line, said test signal line of said first signal transmission means having a length substantially same as the length of said test signal line of said second test signal transmission means.

3. semiconductor integrated circuit as defined in claim 1 wherein each of said test transmission line includes at least one test signal line and at least one buffer, said test signal line of said first signal transmission means having a length substantially same as the length of said test signal line of said second signal transmission line, said buffer of said first signal transmission means producing a signal delay substantially same as the signal delay of said buffer of said second transmission means.

4. A semiconductor integrated circuit as defined in claim 1 wherein said coincidence detection means includes an exclusive OR gate.

5. A semiconductor integrated circuit comprising: a clock signal input pin for receiving a clock signal; a test signal input pin for receiving a test signal; a first through fourth flip flops each having a data input and a clock input; a first and a second test signal transmission means each for transmitting said test signal to said data input of corresponding one of said first and second flip flops, said first signal transmission means producing a propagation delay substantially same as the propagation delay of said second signal transmission means; a third and fourth test signal transmission means each for transmitting said test signal to said data input of corresponding one of said third and fourth flip flops, said third signal transmission means producing a propagation delay substantially same as the propagation delay of said fourth signal transmission means; a first and a second clock signal transmission means each for transmitting said clock signal to said clock input of corresponding one of said first and second flip flops, said first clock signal transmission means producing a propagation delay smaller than the propagation delay of said second clock signal transmission means; a third and a fourth clock signal transmission means each for transmitting said clock signal to said clock input of corresponding one of said third and fourth flip flops, said third clock signal transmission means producing a propagation delay substantially same as the propagation delay of said fourth clock signal transmission means; a selector, responsive to a control signal, for selecting the outputs of said first and second flip flops or the outputs of said third and fourth flip flops to supply a pair of outputs of said selector; and a coincidence detection means for detecting coincidence between said pair of outputs of said selector.

6. A semiconductor integrated circuit as defined in claim 5 wherein each of said test signal transmission means includes a test signal line, said test signal line of said first transmission line having a length substantially same as the length of said test signal line of said second test signal transmission means, said test signal line of said third transmission line having a length substantially same as the length of said test signal line of said fourth test signal transmission means.

7. A semiconductor integrated circuit as defined in claim 5 wherein each of said test transmission line includes at least one test signal line and at least one buffer, said test signal line of said first signal transmission means having a length substantially same as the length of said test signal lines of said second signal transmission line, said buffer of said first signal transmission means producing a signal delay substantially same as the signal delay of said buffer of said second transmission means, said test signal line of said third signal transmission means having a length substantially same as the length of said test signal lines of said fourth signal transmission line, said buffer of said third signal transmission means producing a signal delay substantially same as the signal delay of said buffer of said fourth transmission means.

8. A semiconductor integrated circuit as defined in claim 5 wherein said coincidence detection means includes an exclusive OR gate.

* * * * *